United States Patent
Likhanskii et al.

(10) Patent No.: US 12,125,680 B2
(45) Date of Patent: Oct. 22, 2024

(54) ION EXTRACTION ASSEMBLY HAVING VARIABLE ELECTRODE THICKNESS FOR BEAM UNIFORMITY CONTROL

(71) Applicant: Applied Materials, Inc., Santa Clara, CA (US)

(72) Inventors: Alexandre Likhanskii, Malden, MA (US); Alan V. Hayes, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 365 days.

(21) Appl. No.: 17/512,310

(22) Filed: Oct. 27, 2021

(65) Prior Publication Data
US 2023/0125435 A1 Apr. 27, 2023

(51) Int. Cl.
*H01J 37/32* (2006.01)

(52) U.S. Cl.
CPC ... *H01J 37/32339* (2013.01); *H01J 2237/083* (2013.01)

(58) Field of Classification Search
CPC .......... H01J 37/32339; H01J 2237/083
See application file for complete search history.

(56) References Cited

U.S. PATENT DOCUMENTS

| | | | |
|---|---|---|---|
| 6,407,399 B1 | 6/2002 | Livesay | |
| 7,244,474 B2 | 7/2007 | Hanawa | |
| 2004/0108469 A1 | 6/2004 | Ichiki | |
| 2005/0016838 A1 | 1/2005 | Murata | |
| 2015/0179405 A1* | 6/2015 | Saito | H01J 37/32568 156/345.1 |
| 2018/0053628 A1* | 2/2018 | Vaniapura | H01J 37/32522 |

OTHER PUBLICATIONS

International Search Report and Written Opinion for Application No. PCT/US2022/044855, mailed Jan. 13, 2023, 7 pages.

* cited by examiner

*Primary Examiner* — Nicole M Ippolito
(74) *Attorney, Agent, or Firm* — KDW FIRM PLLC

(57) ABSTRACT

An ion extraction assembly for an ion source is provided. The ion extraction assembly may include a plurality of electrodes, wherein the plurality of electrodes comprises: a plasma-facing electrode, arranged for coupling to a plasma chamber; and a substrate-facing electrode, disposed outside of the plasma-facing electrode. The at least one electrode of the plurality of electrodes may include a grid structure, defining a plurality of holes, wherein the at least one electrode has a non-uniform thickness, wherein a first grid thickness in a middle region of the at least one electrode is different than a second grid thickness, in an outer region of the at least one electrode.

18 Claims, 6 Drawing Sheets

ION EXTRACTION ASSEMBLY HAVING VARIABLE ELECTRODE THICKNESS FOR BEAM UNIFORMITY CONTROL

FIELD OF THE DISCLOSURE

The disclosure relates generally to processing apparatus, and more particularly to plasma based ion sources.

BACKGROUND OF THE DISCLOSURE

In the present day, plasmas are used to process substrates, such as electronic devices, for applications such as substrate etching, layer deposition, ion implantation, and other processes. Some processing apparatus employ a plasma chamber that generates a plasma to act as an ion source for substrate processing. An ion beam may be extracted through an extraction assembly and directed to a substrate in an adjacent chamber. This plasma may be generated in various ways.

In various commercial systems, plasma chambers employ extraction optics to generate a wide ion beam. As an example, grid-type extraction optics may be installed along one side of a plasma chamber to generate a wide ion beam through a two-dimensional grid of extraction apertures. Such a grid may have a diameter on the order of up to half a meter or so.

In many applications ion beam current density uniformity is called for across the entire grid. Alternatively, in some cases a specific ion beam (current density) profile may be desirable. To adjust this profile, e.g. to compensate for plasma non-uniformities that may lead to non-uniformity in the extracted ion beam, plasma shapers or magnets may be employed. Such approaches are complex and relatively expensive to implement and are hard to optimize precisely. Other approaches used to adjust the ion beam profile involve changing the pitch between grid holes or changing the size of grid holes in different regions of a grid. These approaches are easy to optimize by empirical iteration, and have some ability to compensate for plasma non-uniformity in the plasma chamber. However, they have the unwanted side effect of generating different beam divergence in the extracted beamlets as a function of position. This differential beam divergence may lead to reduced device yield uniformity across a substrate.

With respect to these and other considerations the present disclosure is provided.

BRIEF SUMMARY

In one embodiment, an ion extraction assembly for an ion source is provided. The ion extraction assembly may include a plurality of electrodes, wherein the plurality of electrodes comprises: a plasma-facing electrode, arranged for coupling to a plasma chamber; and a substrate-facing electrode, disposed outside of the plasma-facing electrode. The at least one electrode of the plurality of electrodes may comprise: a grid structure, defining a plurality of holes, wherein the at least one electrode has a non-uniform thickness, wherein a first grid thickness in a middle region of the at least one electrode is different than a second grid thickness, in an outer region of the at least one electrode.

In another embodiment, an ion source may include a plasma chamber; and an ion extraction assembly, disposed along a side of the plasma chamber. The ion extraction assembly may include a plurality of electrodes, including a plasma-facing electrode. At least one electrode of the plurality of electrodes comprises: a grid structure, defining a plurality of holes, wherein the at least one electrode has a non-uniform thickness, wherein a first grid thickness in a middle region of the at least one electrode is different than a second grid thickness, in an outer region of the at least one electrode.

In a further embodiment, a processing system, comprising: a plasma chamber; a power generator coupled to generate a plasma in the plasma chamber, and an ion extraction assembly, disposed along a side of the plasma chamber. The ion extraction assembly may include a plurality of electrodes, including a plasma-facing electrode. The plasma-facing electrode may include: a grid structure, defining a plurality of holes, wherein at least one electrode of the plurality of electrodes has a non-uniform thickness, wherein a first grid thickness in a middle region of the at least one electrode is different than a second grid thickness, in an outer region of the at least one electrode. The processing system may include a substrate stage, disposed facing the ion extraction assembly.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for modified ion beam profiles and, specifically, improved ion beam uniformity in a processing apparatus, and in particular in compact ion beam processing apparatus. The present embodiments may be suitable for applications where the ion beam profile at the point of extraction of an ion beam is useful across one or more directions.

Figure 1A:
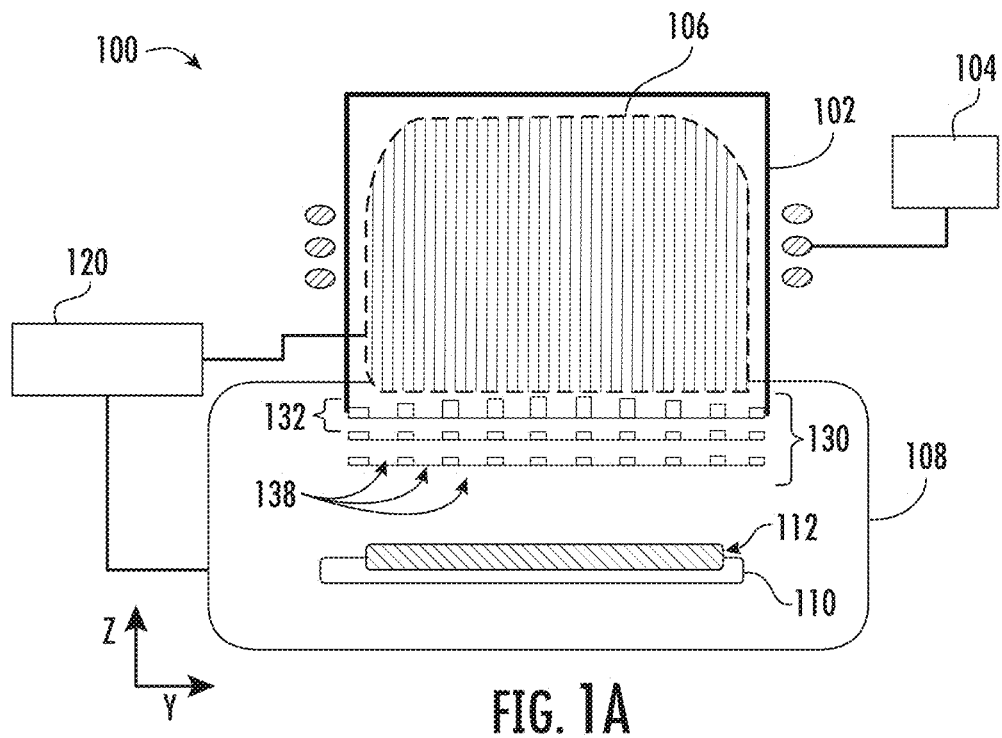
FIG. 1A shows a side view of an exemplary processing system, according to embodiments of the disclosure.

FIG. 1A shows a side view of an exemplary system, according to embodiments of the disclosure. The system will be referred to herein as processing system 100. The processing system 100 may be suitable for ion beam processing of a substrate 112. The processing system 100 includes a plasma chamber 102 to house a plasma 106, a power generator 104, coupled to deliver power to generate the plasma 106, when a suitable gaseous species (not separately shown) is delivered to the plasma chamber 102. The power generator 104 may be an RF power generator, for example, arranged to generate an inductively coupled plasma according to some embodiments. However, in other embodiments, the plasma 106 may be generated by any suitable means. A beam power supply 120 connected to an electrode immersed in the plasma (not shown, but may be the plasma-facing electrode) is used to raise the potential of the plasma 106 to a positive potential above the potential of the process chamber 108 (typically at earth ground). Said differently, the beam power supply 120 supplies to potential that defines the energy of ions striking the substrate 112, where the ions exit the plasma 106 at a plasma potential defined by the high voltage side of the beam power supply 120, where the substrate 112 potential is also defined by the low voltage side of the beam power supply 120.

As shown in FIG. 1A, a substrate 112 may be disposed in a process chamber 108, adjacent the plasma chamber 102, on a substrate holder 110. The substrate and holder may be oriented such that the face of the wafer normal is parallel to the axis of the extracted ion beam, as shown, or tilted at some angle to this axis. The substrate and holder may also be also may be rotated about some axis or moved in the beam to improve the uniformity of the ion beam treatment.

The processing system 100 may further include an ion extraction assembly 130, disposed along a side of the plasma chamber 102. As shown, the ion extraction assembly 130 may include a plurality of electrodes, which electrodes may be configured as grids having an array of holes to generate a plurality of ion beamlets that are directed to the substrate 112. In some embodiments, the ion extraction assembly 130 may include three electrodes, while in other embodiments the ion extraction assembly 130 may include two electrodes.

In accordance with various embodiments of the disclosure, the ion extraction assembly 130 has a plasma-facing electrode 132, nearest the plasma chamber 102. The plasma-facing electrode 132 may generally be configured at the same potential as the plasma chamber 102, while other electrode(s) of the ion extraction assembly 130 may be biased negatively with respect to the plasma chamber 102. Such particular biasing configuration is not specifically shown in FIG. 1A. The substrate 112 and/or process chamber 108 may generally be biased negatively with respect to the plasma chamber 102, in order to generate an ion beam having a targeted energy.

Turning specifically to the plasma-facing electrode 132, this electrode is formed of a grid structure, defining a plurality of holes. The holes may be arranged as a two-dimensional grid pattern, for example. Likewise, the additional electrodes in the ion extraction assembly 130 may have similar grid pattern in two dimensions, so as to define a two-dimensional array of apertures 138 to conduct beamlets to the substrate 112.

According to various embodiments, the size of the ion extraction assembly 130 in the X-Y plane may equal to or exceed the size of the substrate 112 is the x-y plane, such that an ion beam generated by the ion extraction assembly 130 may cover an entirety of the substrate 112.

Figure 1B:
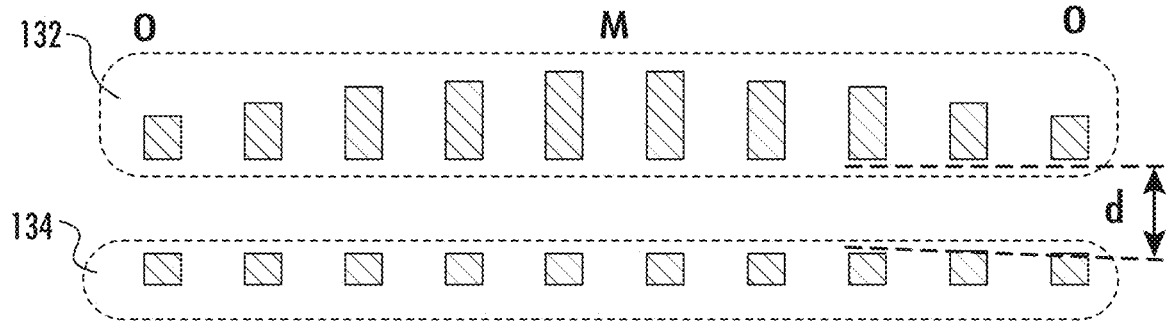
FIG. 1B shows a side cross-sectional view of an ion extraction assembly, according to embodiments of the disclosure.
Figure 1C:
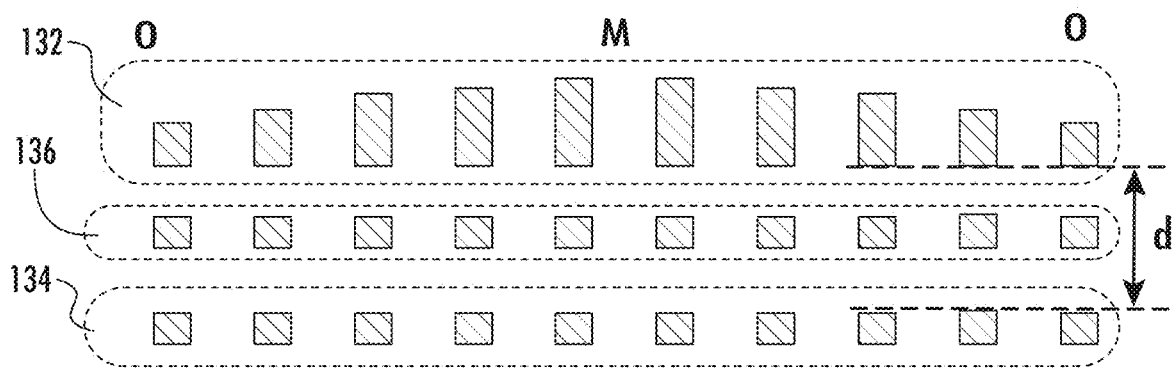
FIG. 1C shows a side cross-sectional view of another ion extraction assembly, according to other embodiments of the disclosure.

In accordance with embodiments of the disclosure, the plasma-facing electrode 132 is provided with a non-uniform thickness (meaning non-uniform height along the z-direction). In particular, a first grid thickness in a middle region M of the plasma-facing electrode is greater than a second grid thickness, in an outer region O of the plasma-facing electrode, as shown more clearly in FIG. 1B. In particular, FIG. 1B shows a side cross-sectional view of an ion extraction assembly, according to embodiments of the disclosure, where two electrodes are provided, including a substrate-facing electrode 134. Moreover, FIG. 1C shows a side cross-sectional view of another ion extraction assembly, according to other embodiments of the disclosure, where three electrodes are provided, including a suppression electrode 136, disposed between the plasma-facing electrode 132, and the substrate-facing electrode 134. In some examples, the substrate-facing electrode 134 may act as a decelerating electrode. For example, the substrate-facing electrode may act as a ground electrode or grounded electrode, meaning being fixed at a ground potential, while the suppression electrode is fixed at a negative voltage.

In each of these embodiments, the plasma-facing electrode 132 is formed of a grid having non-uniform thickness, as shown. Suitable thickness for the plasma-facing electrode 132 may be approximately 1 cm or less according to some non-limiting embodiments. For example, the grid structure of the plasma-facing electrode 132 may have a thickness of less than one centimeter in the middle region M, with a decreasing thickness toward the outer region O, such that the thickness is at least two millimeters in the outer region O. Much smaller thickness variations can also be used for finer tuning, limited just by the grid thickness tolerances, which tolerances are typically are on the order of 1-2% of the nominal grid thickness. Moreover, the grid structure in these embodiments may define a hole size between one millimeter and five millimeters, according to some embodiments. Suitable materials for the plasma-facing electrode may include molybdenum or carbon, for example, which materials may be readily machinable to generate the tapered grid structure as pictured in FIG. 1B and FIG. 1C. Note that in various embodiments, the additional electrode(s) of the ion extraction assembly 130 may have uniform thickness, and may be configured generally as in known diode or triode extraction assembly.

Figure 1D:
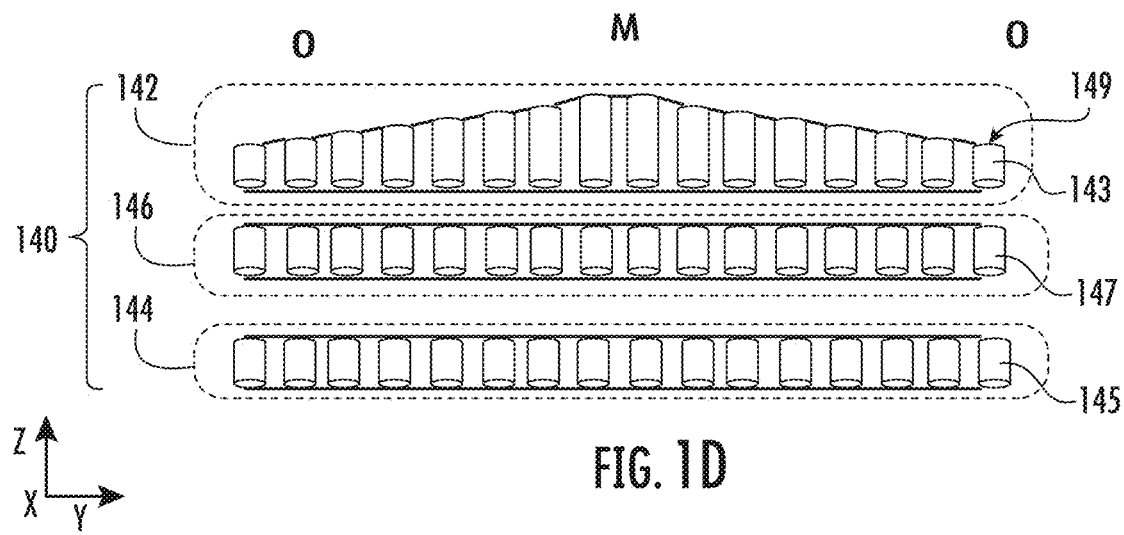
FIG. 1D shows a side cross-sectional view of a variant of the ion extraction assembly of FIG. 1C.

FIG. 1D shows a side cross-sectional view of a variant of the ion extraction assembly of FIG. 1C. In this example, an ion extraction assembly 140 includes three electrodes, arranged as a grid of holes. The ion extraction assembly 140 includes a screen electrode or plasma-facing electrode 142, a suppression electrode 146, and a substrate-facing electrode, which electrode may act as a deceleration electrode, thus termed deceleration electrode 144 herein. As shown in FIG. 1D, the plasma-facing electrode 142 is formed of an (2-D) array of holes, where a hole 143 is represented as a cylindrical feature. The same goes for the holes 147 of suppression electrode 146, and holes 145 of deceleration electrode 144. As shown, in the plasma-facing electrode, the overall thickness of the grid decreases from the inner region to the outer region. One feature of the plasma-facing electrode 142 is that the grid thickness is uniform in the regions where the holes 143 are present, while the grid thickness changes between holes, as shown in FIG. 1D. Said differently, the top surface 149 of holes 143 are aligned parallel to the X-Y plane. An advantage of this configuration is that a meniscus forming at the top of holes 143 will tend to direct extracted ions along trajectories parallel to the Z-direction. However, in other embodiments, the grid thickness may vary across holes. In such embodiments, the relative change in thickness may cause a slight tilt in a meniscus, resulting in a slight tilt of ion trajectories with respect to the Z-direction. However, this tilt (if present) may be within an acceptable range according to process requirements.

Figure 1E:
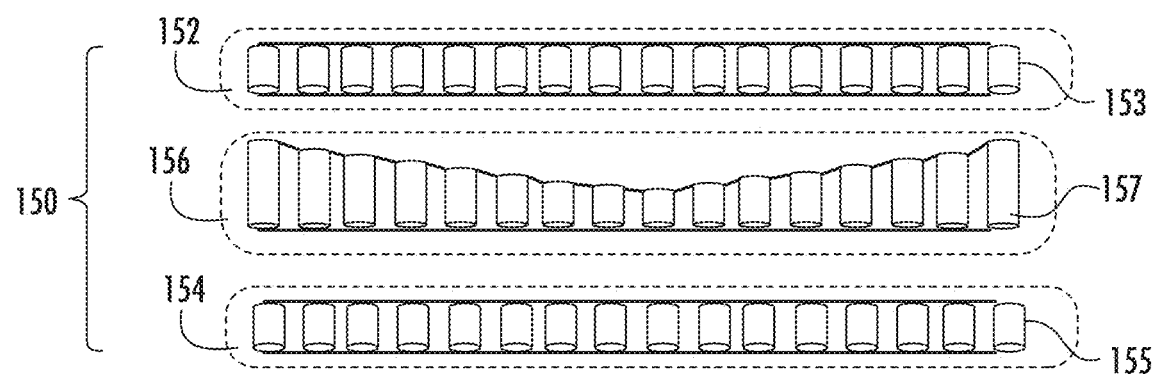
FIG. 1E shows a side cross-sectional view of a further ion extraction assembly, according to other embodiments of the disclosure.

FIG. 1E shows a side cross-sectional view of a further ion extraction assembly, according to other embodiments of the disclosure. In this example, an ion extraction assembly 150 includes three electrodes, arranged as a grid of holes. The ion extraction assembly 150 includes a screen electrode or plasma-facing electrode 152, a suppression electrode 156, and a substrate-facing electrode, which electrode may act as a deceleration electrode, thus termed deceleration electrode 154 herein. As shown in FIG. 1E, the plasma-facing electrode 152 is formed of an (2-D) array of holes, where a hole 153 is represented by a cylindrical feature. Similarly, the suppression electrode 156 is formed of an (2-D) array of holes, where a hole 157 is represented as a cylindrical feature, while the deceleration electrode 154 includes holes 155, also shown as a cylindrical features. In this example, the plasma-facing electrode 152 and the deceleration electrode 154 may have a uniform thickness. As shown, for the suppression electrode 156, the overall thickness of the grid increases from the inner region to the outer region.

Figure 1F:
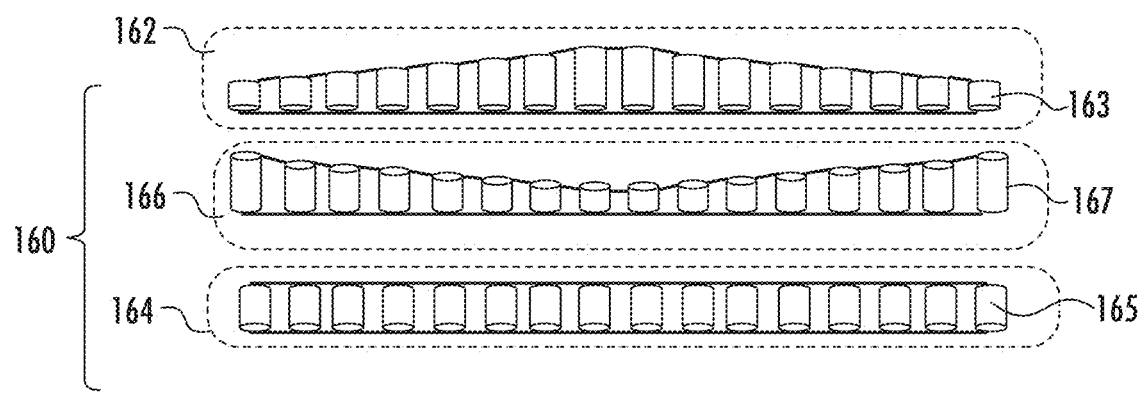
FIG. 1F shows a side cross-sectional view of a yet another ion extraction assembly, according to other embodiments of the disclosure.

FIG. 1F shows a side cross-sectional view of a further ion extraction assembly, according to other embodiments of the disclosure. In this example, an ion extraction assembly 160 includes three electrodes, arranged as a grid of holes. The ion extraction assembly 160 includes a screen electrode or plasma-facing electrode 162, a suppression electrode 166, and a substrate-facing electrode, which electrode may act as a deceleration electrode, thus termed deceleration electrode 164 herein. As shown in FIG. 1F, the plasma-facing electrode 152 is formed of an (2-D) array of holes, where a hole 163 is represented by a cylindrical feature. Similarly, the suppression electrode 166 is formed of an (2-D) array of holes, where a hole 167 is represented as a cylindrical feature, while the deceleration electrode 164 includes holes 165, also shown as a cylindrical features. In this example, the deceleration electrode 164 may have a uniform thickness. As shown, for both the plasma-facing electrode 162 and the suppression electrode 166, the overall thickness of the grid decreases from the inner region to the outer region. An advantage of this configuration, is that the effect on ion beam properties (detailed below) achieved by changing grid thickness by a certain amount may be achieved with less thickness change within a given grid.

As detailed with respect to FIGS. 2A-3B to follow, one salutary feature of the embodiments of FIGS. 1A-1F, as provided by the non-uniform thickness of the grid structure of at least one grid of a grid assembly, is the ability to compensate for non-uniformities in ion beam current density, e.g. due to plasma density variation within a plasma chamber 102.

Figure 2A:
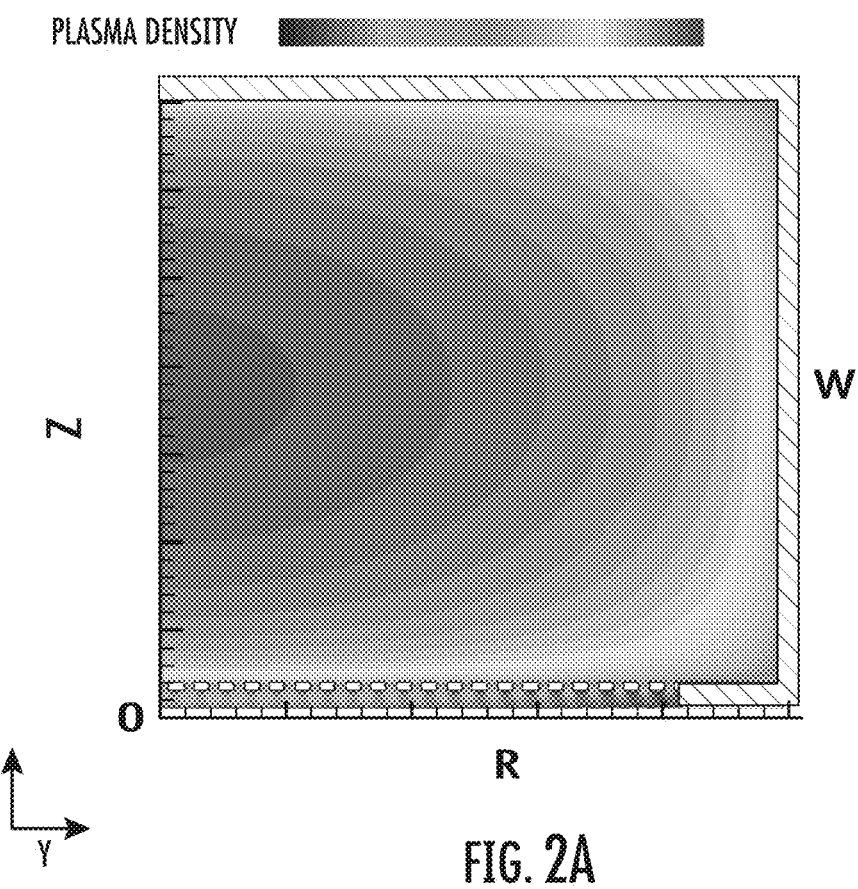
FIG. 2A is a composite illustration showing simulated plasma density in a reference plasma chamber having a known extraction grid configuration.

Turning now to FIG. 2A there is shown a composite illustration showing simulated plasma density in a reference plasma chamber having a known extraction grid configuration. The reference plasma chamber may be configured as in known ion beam etching apparatus, where a uniform ion extraction assembly is provided to generate an ion beam. The view of FIG. 2A shows the cross-section of one half of a plasma chamber, with the center or middle portion to the extreme left of the figure at the R=0 point. The different contours within the plasma chamber indicate different levels of plasma density. Generally, the plasma density may vary substantially within a plasma chamber, as shown. In many systems the plasma density may be on the order of $E16/m^3$-$E17/m^3$ in the central region of the plasma chamber, transitioning steeply to zero near the walls. In the view of FIG. 2A, a plasma-facing grid is shown, having uniform thickness along the horizontal direction, represented by R. In some embodiments, the height along the Z direction and width along the R direction may be on the order of ten centimeters to a few tens of centimeters. In the example of FIG. 2A, the plasma density decreases from the center region, and especially toward the vertical wall W of the plasma chamber. This decrease in plasma density within the main plasma chamber toward the vertical walls may be reflected in a corresponding decrease in the ion flux immediately below the plasma-facing grid in those regions of the grid nearer the vertical walls.

Figure 2B:
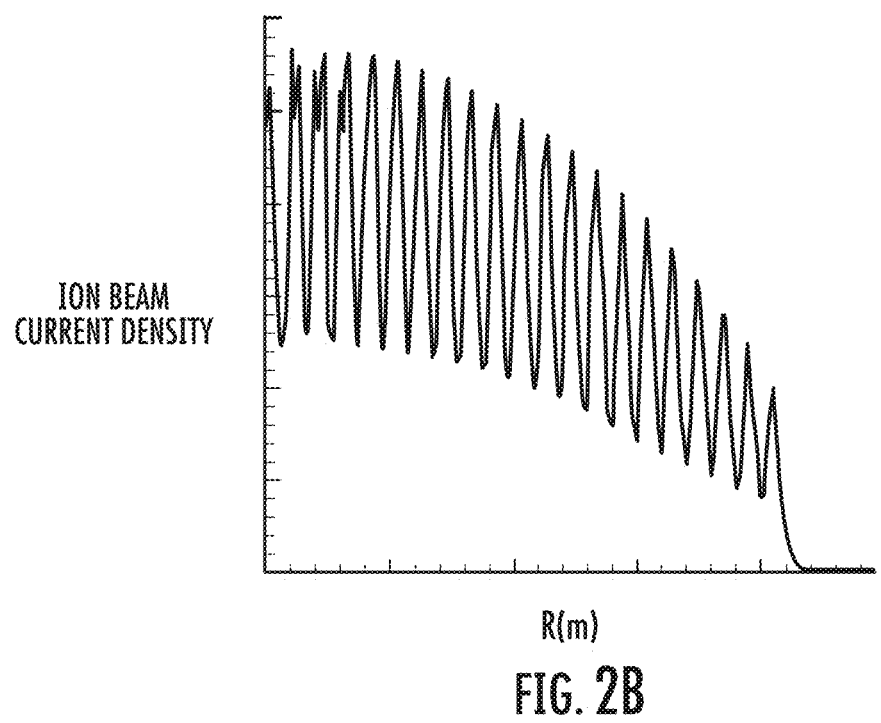
FIG. 2B is a graph showing simulated extracted ion beam current density as a function of position with respect to the axis of the plasma chamber of FIG. 2A.

FIG. 2B is a graph showing simulated ion beam current density as a function of position with respect to the axis of the plasma chamber of FIG. 2A, assuming that the variation in plasma density in the plasma chamber is the sole significant source of variation in the above-mentioned ion flux, and in the ion current extracted from the grid assembly. In general, the ion flux can also vary by variation in electron temperature, the current density by ion impingement on the downstream grids, etc. The sharp fluctuations in current density shown in FIG. 2B reflect the formation of individual beamlets by the grid ion optics. As such, the current density curve forms an envelope, where the peaks may represent the current from each beamlet. Following the peak of the envelope, there is a large and monotonic decrease in current density, where current density remains relatively constant for just one fifth of the distance from the center of the chamber to the edge of the chamber. At larger radius values, the peak current density decreases rapidly, by approximately two thirds, toward the grid edge (note that in various embodiments, the parameter R may stand for a value along an X axis or along a Y axis, such as in embodiments of a cylindrical plasma chamber. Note that as the ion beam propagates toward the substrate, the beamlets from the individual apertures merge and the fluctuations in current density disappear, but the downstream ion beam current density distribution may essentially reflect the shape of the envelope of the extracted ion beam current density.

Figure 3A:
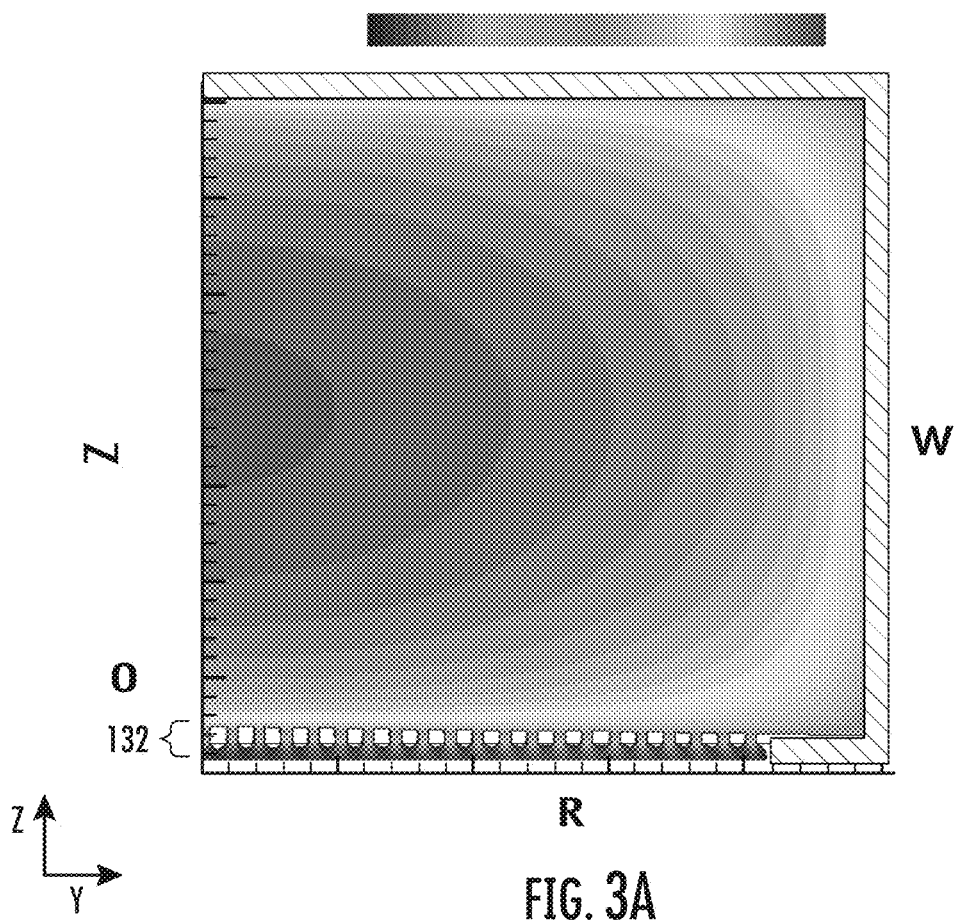
FIG. 3A is a composite illustration showing simulated plasma density in a chamber having an extraction grid assembly arranged according to the present embodiments.

FIG. 3A is a composite illustration showing simulated plasma density in a chamber having an extraction grid assembly arranged according to the present embodiments. The view of FIG. 3A again shows the cross-section of one half of a plasma chamber, with the center or middle portion to the extreme left of the figure. The different contours within the plasma chamber indicate different levels of plasma density as noted previously with respect to FIG. 2A. For clarity of comparison, the plasma density and relative density variation is simulated to correspond closely to the scenario of FIG. 2A. The plasma density decreases from the center region, and especially toward the vertical walls W of the plasma chamber. In the view of FIG. 3A, a plasma-facing electrode 132 is shown, arranged generally as described above with respect to the embodiment of FIG. 1A. In particular, the grid thickness decreases from 9 mm in the middle of the plasma chamber to 4 mm toward the outside of the plasma chamber. As detailed below, and as pictorially shown in FIG. 3A, unlike the example of FIG. 2A, this decrease in plasma density within the main plasma chamber toward the vertical walls is not reflected in a systematic decrease in ion flux immediately below the plasma-facing grid.

Figure 3B:
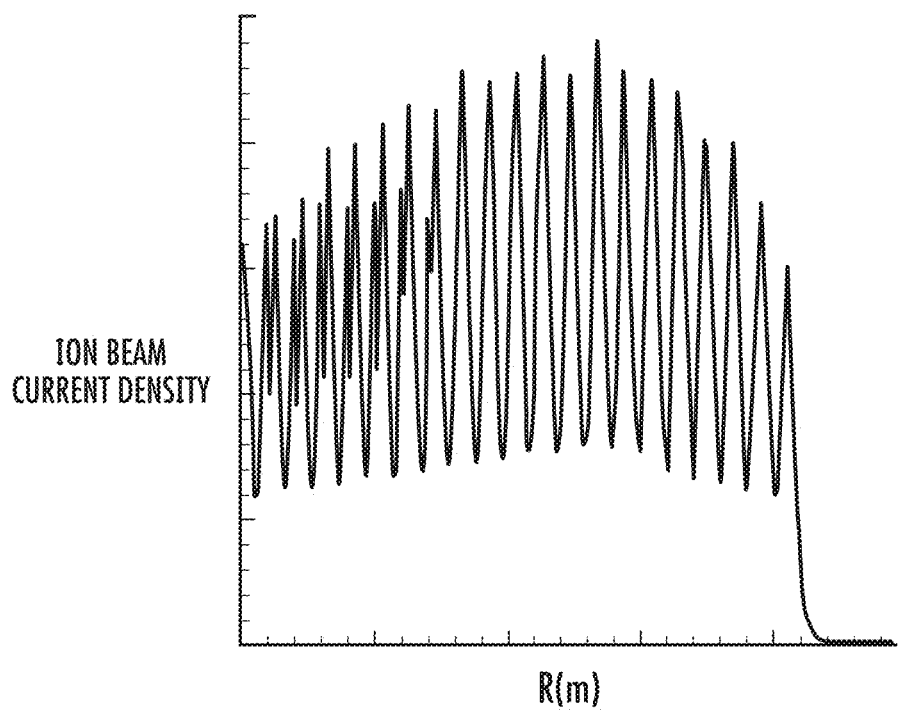
FIG. 3B is a graph showing simulated extracted ion beam current density as a function of position with respect to the axis of the plasma chamber of FIG. 3A.

FIG. 3B is a graph showing simulated ion beam (grid) current as a function of substrate position with respect to the axis of the plasma chamber of FIG. 2A, assuming that the variation in plasma density in the plasma chamber is the sole significant source of variation in the above-mentioned ion flux, and in the ion current extracted from the grid assembly. In general, the ion flux can also vary by variation in electron temperature; the current density by ion impingement on the downstream grids, etc. The sharp fluctuations in current density shown in FIG. 3B reflect the formation of individual beamlets by the grid ion optics. As such, the current density curve forms an envelope, where the peaks may represent the current in the aperture positions. Following the peak of the envelope, there is an initial increase in current density going from the center region to a zone intermediate between the center of the grid (R=0) and the outside of the grid. Overall, the current density extracted in the middle of the chamber (R=0) is approximately the same as the current density extracted at the outer edge of the plasma facing electrode 132. Moreover, the largest difference in current density is just approximately 33%, reflected in the increased current density at the intermediate region.

Without being bound by a particular theory, the results of changing extracted beam current by purposively changing grid thickness may be explained in the following manner. When a plasma is formed, the plasma side of a screen grid (plasma-facing grid) will generate a plasma meniscus. The exact shape of the meniscus and extracted current from the meniscus will depend on the electric field generated in a grid assembly adjacent the plasma. In turn, the strength of this electric field, the meniscus shape, and extracted current will be determined by the distance between the biased electrode (suppression grid) and the plasma meniscus, as well as the potential placed upon the suppression electrode with respect to the plasma potential. For a given suppression electrode potential, the potential difference between plasma meniscus and suppression electrode will be constant. However, for a grid of varying thickness, the distance (along the Z-axis) between plasma meniscus and suppression electrode will vary, thus generating a variable electric field and concomitant variable extracted current across the screen grid (in the x-y plane). This variable distance is created by each of the electrode assembly geometries of FIGS. 1A-1F.

Figure 4:
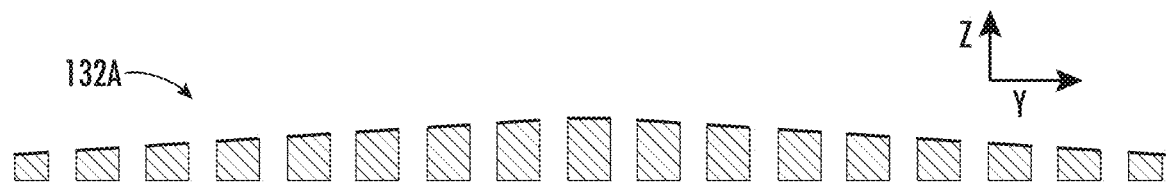
FIG. 4 is a side cross-sectional view of an exemplary plasma-facing grid according to embodiments of the disclosure.

An enlarged view of an example of a plasma-facing grid arranged similar to the case of FIG. 3A is shown in FIG. 4. In this example, the plasma facing electrode or plasma-facing grid 132A is arranged with a linearly-decreasing thickness from center to outside. Thus, in three-dimensions, the plasma-facing grid 132A may have a shallow pyramid shape. Note that in this configuration, while the overall extracted current density variation is much less than in the reference system of FIG. 2B, the pyramidal plasma grid shape appears to overcompensate for the decrease in extracted current density observed in a uniform-thickness plasma-facing grid (FIG. 2B), especially in the region within approximately 12 cm of the center. In other embodiments, a non-uniform thickness plasma-facing grid may have other suitable shapes.

Figure 5A:
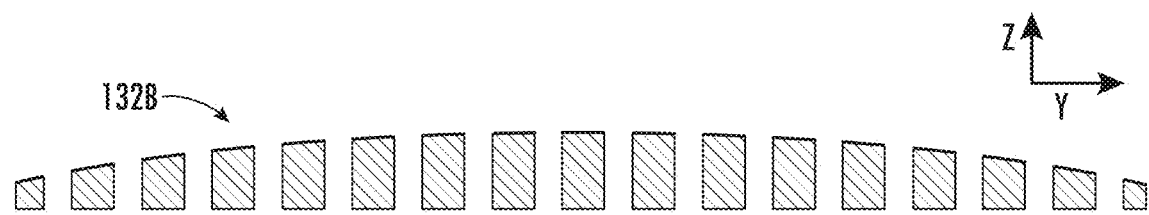
FIG. 5A is a side cross-sectional view of another exemplary extraction grid according to embodiments of the disclosure.
Figure 5B:
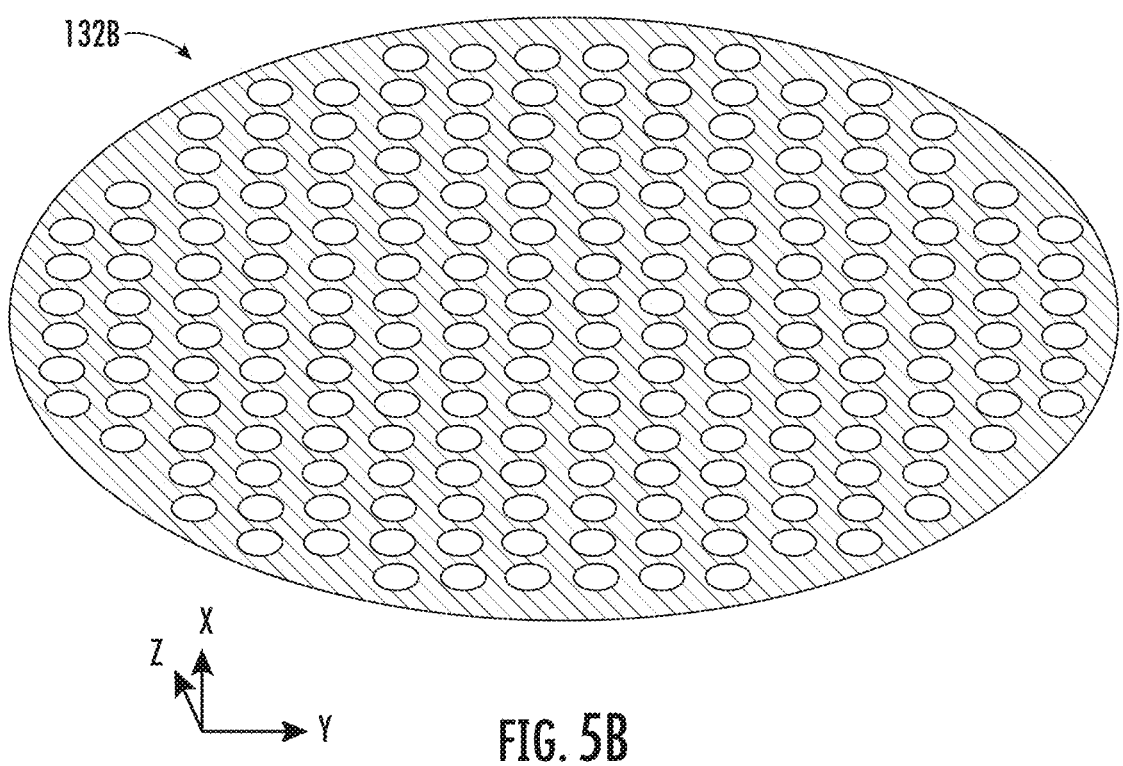
FIG. 5B is a top perspective view of the extraction grid of FIG. 5A.

FIG. 5A is a side cross-sectional view of another exemplary plasma-facing grid according to embodiments of the disclosure. FIG. 5B is a top perspective view of the plasma-facing grid of FIG. 5A. The plasma-facing grid 132B in this example has a dome shape. Note the relative scale along the Z-direction may be exaggerated. Thus, an exemplary extraction grid having a diameter of ~40 cm, may have a maximum thickness on the order of 1 cm, and a minimum thickness on the order of ¼ mm, according to some non-limiting embodiments. The dome-shape imparts a more gradual change in grid thickness as a function of radius from the center of the plasma-facing grid 132B, as compared to plasma-facing grid 132A. Accordingly, the increase in extracted beam current density shown in FIG. 3B for a linearly-decreasing-thickness grid may be eliminated or reduced. Of course, other shapes for grid cross-sections are possible, according to other embodiments, and may be determined experimentally. Generally, according to other embodiments of the disclosure, a grid cross-section having non-uniform thickness may be designed with any suitable profile to generate a targeted uniformity or non-uniformity in extracted beam current density across the width of the grid. For example, the grid may have a monotonically varying thickness from a center of the grid to an edge of the grid, having any suitable shape, or may have a non-monotonic variation in thickness a center of the grid to an edge of the grid.

Figure 6:
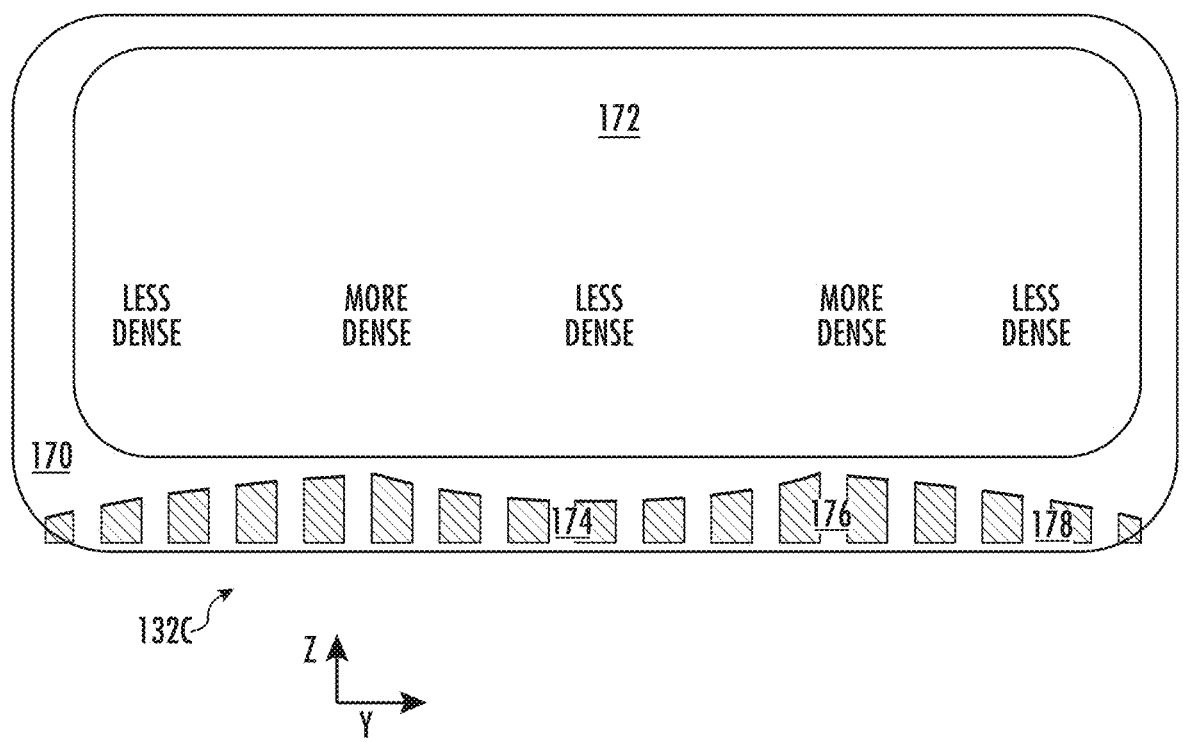
FIG. 6 is a side cross-sectional view of another exemplary extraction grid according to embodiments of the disclosure.

FIG. 6 is a side cross-sectional view of another exemplary extraction grid according to embodiments of the disclosure, showing a non-monotonic change in grid thickness from middle portion to outer portion. In this example, the plasma-facing grid 132C is arranged with a recessed middle portion 174, having relatively less thickness than the thickness of an intermediate portion 176. In an outer portion 178, the thickness of the plasma-facing grid 132C is again less than in the intermediate portion 176. Such a grid thickness profile may be suitable for a plasma chamber 170 where plasma density of a plasma 172 is depressed in the middle of the plasma chamber, and is more peaked in density the intermediate region, adjacent the middle portion, as indicated in FIG. 6.

In various embodiments, the exact shape and thickness contour of a plasma-facing grid of non-uniform thickness may be tailored according to a plasma chamber characteristic. For example, a given process recipe may generate a given internal plasma density profile along the R direction within the plasma chamber. Based upon this internal plasma density profile, the contour (in the R-Z plane) of the plasma-facing grid may be adjusted to just offset internal plasma density profile, such that the extracted beam density as a function of R may be uniform.

In some embodiments, components such as plasma shapers may be employed in conjunction with a variable thickness plasma-facing grid to control extracted beam current uniformity from an extraction grid assembly. In addition, or alternatively, grid hole size or grid hole density may be varied in conjunction with a variable thickness plasma-facing grid to further control beam current uniformity.

In view of the above, the present disclosure provides at least the following advantages. As a first advantage, the present embodiments provide components to generate uniform ion beam current without complex and expensive plasma source design. Another advantage is that a uniform ion current may be extracted across an ion extraction assembly without changing other beam characteristics, such as beam divergence. A further advantage is that the plasma-facing grids of the present embodiments may be fabricated without complex drilling techniques, since the size of grid apertures (holes) and spacing of holes may be uniform.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion extraction assembly for an ion source, comprising:
a plurality of electrodes, wherein the plurality of electrodes comprises:
a plasma-facing electrode, arranged for coupling to a plasma chamber; and
a substrate-facing electrode, separate from, and independently biasable relative to, the plasma-facing electrode, disposed outside of the plasma-facing electrode,
wherein at least one electrode of the plurality of electrodes comprises:
a grid structure, defining a plurality of holes for conducting ion beamlets to a substrate, wherein the at least one electrode has a non-uniform thickness, wherein a first grid thickness in a middle region of the at least one electrode is different than a second grid thickness, in an outer region of the at least one electrode.

2. The ion extraction assembly of claim 1, wherein the grid structure defines a two-dimensional array of holes.

3. The ion extraction assembly of claim 1, wherein the grid structure defines a linear variation in grid thickness from the middle region to the outer region, or a non-monotonic variation in grid thickness from the middle region to the outer region.

4. The ion extraction assembly of claim 1, wherein the grid structure defines a dome shape.

5. The ion extraction assembly of claim 1, wherein the grid structure has a thickness of less than or equal to one centimeter in the middle region, and has a thickness of at least one quarter of one millimeters in the outer region.

6. The ion extraction assembly of claim 1, wherein the ion extraction assembly further comprises:
a suppression electrode, disposed between the plasma-facing electrode and the substrate-facing electrode, wherein the substrate-facing electrode acts as a ground electrode.

7. The ion extraction assembly of claim 6, wherein the at least one electrode comprises the plasma-facing electrode, the suppression electrode, or both the plasma-facing electrode and the suppression electrode.

8. An ion source, comprising:
a plasma chamber; and
an ion extraction assembly, disposed along a side of the plasma chamber, the ion extraction assembly comprising a plurality of electrodes, including a plasma-facing electrode and another electrode separate form, and independently biasable relative to, the plasma-facing electrode, wherein at least one electrode of the plurality of electrodes comprises:
a grid structure, defining a plurality of holes for conducting ion beamlets to a substrate, wherein the at least one electrode has a non-uniform thickness, wherein a first grid thickness in a middle region of the at least one electrode is different than a second grid thickness, in an outer region of the at least one electrode.

9. The ion source of claim 8, wherein the grid structure defines a two-dimensional array of holes.

10. The ion source of claim 8, wherein the grid structure defines a linear variation in grid thickness from the middle region to the outer region.

11. The ion source of claim 8, wherein the grid structure defines a dome shape.

12. The ion source of claim 8, wherein the grid structure has a thickness of less than one centimeter in the middle region, and has a thickness of at least one quarter of one millimeters in the outer region.

13. The ion source of claim 8, wherein the ion extraction assembly further comprises:
a suppression electrode, disposed adjacent the plasma-facing electrode; and
a grounded electrode, disposed outside of the suppression electrode, wherein the at least one electrode comprises the plasma-facing electrode, the suppression electrode, or both the plasma-facing electrode and the suppression electrode.

14. A processing system, comprising:
a plasma chamber;
a power generator coupled to generate a plasma in the plasma chamber;
an ion extraction assembly, disposed along a side of the plasma chamber, the ion extraction assembly comprising a plurality of electrodes, including a plasma-facing electrode and another electrode separate from, and independently biasable relative to, the plasma-facing electrode, wherein the plasma-facing electrode comprises:
a grid structure, defining a plurality of holes for conducting ion beamlets to a substrate, wherein at least one electrode of the plurality of electrodes has a non-uniform thickness, wherein a first grid thickness in a middle region of the at least one electrode is different than a second grid thickness, in an outer region of the at least one electrode; and
a substrate stage, disposed facing the ion extraction assembly.

15. The processing system of claim 14, wherein the grid structure defines a two-dimensional array of holes.

16. The processing system of claim 14, wherein the grid structure defines a linear variation in grid thickness from the middle region to the outer region.

17. The processing system of claim 14, wherein the grid structure defines a dome shape.

18. The processing system of claim 14, wherein the ion extraction assembly further comprises:
- a suppression electrode, disposed adjacent the plasma-facing electrode; and
- a grounded electrode, disposed outside of the suppression electrode, wherein the at least one electrode comprises the plasma-facing electrode, the suppression electrode, or both the plasma-facing electrode and the suppression electrode.

\* \* \* \* \*